US009419089B1

(12) United States Patent
Lin et al.

(10) Patent No.: US 9,419,089 B1
(45) Date of Patent: Aug. 16, 2016

(54) SEMICONDUCTOR STRUCTURE AND MANUFACTURING METHOD THEREOF

(71) Applicant: UNITED MICROELECTRONICS CORP., Hsin-Chu (TW)

(72) Inventors: Yu-Ying Lin, Tainan (TW); Kuang-Hsiu Chen, Tainan (TW); Ted Ming-Lang Guo, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/714,361

(22) Filed: May 18, 2015

(30) Foreign Application Priority Data

Apr. 24, 2015 (TW) .............................. 104113242 A

(51) Int. Cl.
| H01L 29/06 | (2006.01) |
| H01L 29/423 | (2006.01) |
| H01L 21/3065 | (2006.01) |
| H01L 21/225 | (2006.01) |
| H01L 21/283 | (2006.01) |

(52) U.S. Cl.
CPC ...... *H01L 29/42356* (2013.01); *H01L 21/2253* (2013.01); *H01L 21/283* (2013.01); *H01L 21/3065* (2013.01); *H01L 29/0642* (2013.01); *H01L 29/0692* (2013.01)

(58) Field of Classification Search
CPC ..................... H01L 29/42356; H01L 21/2253; H01L 21/283; H01L 21/3065; H01L 29/0642; H01L 2924/002; H01L 29/7813
See application file for complete search history.

(56) References Cited

U.S. PATENT DOCUMENTS

| 7,335,959 | B2 | 2/2008 | Curello | |
| 7,943,469 | B2 * | 5/2011 | Cook, Jr. | H01L 29/66621 257/E21.619 |
| 8,492,234 | B2 * | 7/2013 | Chan | H01L 21/823412 257/E21.091 |
| 8,552,503 | B2 * | 10/2013 | Hwang | H01L 21/823807 257/368 |
| 8,796,759 | B2 * | 8/2014 | Perng | H01L 29/165 257/328 |
| 9,034,705 | B2 * | 5/2015 | Wen | H01L 21/823814 438/153 |
| 9,048,285 | B2 * | 6/2015 | Chen | H01L 21/76232 |
| 2005/0153490 | A1 * | 7/2005 | Yoon | H01L 21/84 438/164 |
| 2009/0035909 | A1 * | 2/2009 | Chang | H01L 21/823807 438/276 |
| 2012/0074468 | A1 * | 3/2012 | Yeh | H01L 29/165 257/255 |

* cited by examiner

*Primary Examiner* — Yosef Gebreyesus
(74) *Attorney, Agent, or Firm* — Winston Hsu; Scott Margo

(57) ABSTRACT

The present invention provides a semiconductor structure, which includes a substrate, at least two gate structures disposed on the substrate, a first recess, disposed in the substrate between two gate structures, the first recess having a U-shaped cross section profile, and a second recess, disposed on the first recess, the second recess having a polygonal shaped cross section profile, and has at least two tips on two sides of the second recess, the first recess and the second recess forming an epitaxial recess.

9 Claims, 4 Drawing Sheets

SEMICONDUCTOR STRUCTURE AND MANUFACTURING METHOD THEREOF

BACKGROUND OF THE INVENTION

1. Field of the Invention

The invention relates to a semiconductor structure and manufacturing method thereof, and more particularly, to a semiconductor structure with a specific shaped epitaxial recess and manufacturing method thereof.

2. Description of the Prior Art

With semiconductor processes entering the era of the deep submicron meter below 65 nanometer (nm), it has been more and more important to increase the metal-oxide semiconductor (MOS) drive current. To improve device performance, a strained-silicon technique such as a selective epitaxial growth (SEG) method is developed to form epitaxial layers serving as the source/drain of the MOS. Because a lattice constant of the epitaxial layer is different from that of silicon, such characteristic is employed to cause alteration to the band structure of the silicon in the channel region. Accordingly, carrier mobility of the channel region is enhanced and thus device performance is improved.

SUMMARY OF THE INVENTION

The present invention provides a semiconductor structure, which comprises a substrate, at least two gate structures disposed on the substrate, a first recess, disposed in the substrate between two gate structures, wherein the first recess has a U-shaped cross section profile, and a second recess, disposed on the first recess, wherein the second recess has a polygonal shaped cross section profile, and has at least two tips on two sides of the second recess, the first recess and the second recess forming an epitaxial recess.

The present invention provides a method for forming a semiconductor structure, comprising: firstly, a substrate is provided, next, a first dry etching process is performed, to form a recess in the substrate. Afterwards, an ion implantation process is performed to a bottom surface of the recess, a wet etching process is then performed, to etch partial sidewalls of the recess, so as to form at least two tips on two sides of the recess respectively, and a second dry etching process is performed, to etch partial bottom surface of the recess, wherein after the second dry etching process is performed, a lower portion of the recess has a U-shaped cross section profile.

The epitaxial recess of the present invention can be formed through performing the steps in sequence. The upper portion of the epitaxial recess has a diamond-shaped (or hexagonal shaped) profile, and the lower portion of the epitaxial recess has a flat bottom. It is noteworthy that the diamond-shaped upper portion has at least a tip directing toward the channel region, therefore the epitaxial layer formed along the surface of the recess obtains a tip toward the channel region. Accordingly, effective stress provided by the epitaxial layer to the channel region is enhanced. On the other hand, the epitaxial layer formed along the flat bottom of the recess obtains a flat bottom, consequently. Therefore, device leakage that used to occur at the tip is avoided. Briefly speaking, the manufacturing method provided by the present invention not only enhances the device performance but also the device reliability.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
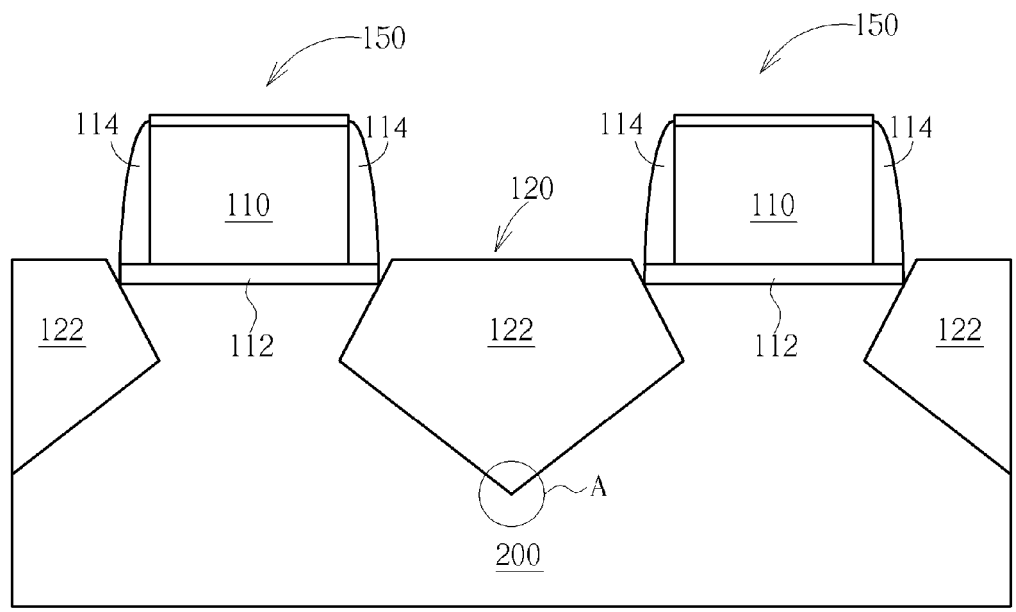
FIG. 1 is a schematic drawing illustrating a semiconductor structure applied with the SEG method.

Please refer to FIG. 1, which is a schematic drawing illustrating a semiconductor structure applied with the SEG method. As shown in FIG. 1, a semiconductor device 150 is positioned on a substrate 100. The semiconductor structure 150 includes a gate conductive layer 110 and a gate dielectric layer 112. A spacer 114 is formed on the sidewalls of the gate conductive layer 110 and the gate dielectric layer 112, and recesses 120 are respectively formed in the substrate 100 at two sides of the spacer 114. The recess 120 includes an epitaxial layer 122 formed therein. Furthermore, it is well-known that the epitaxial layer 122 is formed along the surface of the recess 120 during the SEG method. Therefore shapes and crystalline orientation of each surface of the recess 120 also render impacts to the epitaxial layer 122. For example, the recess 120 of the conventional semiconductor device 150 typically includes a V shape, therefore the epitaxial layer 122 formed along the surfaces of the recesses 120 obtains a V-shaped tip (as emphasized by circle A). Moreover, it is found that device leakage always occurs at the tip.

Figure 2:
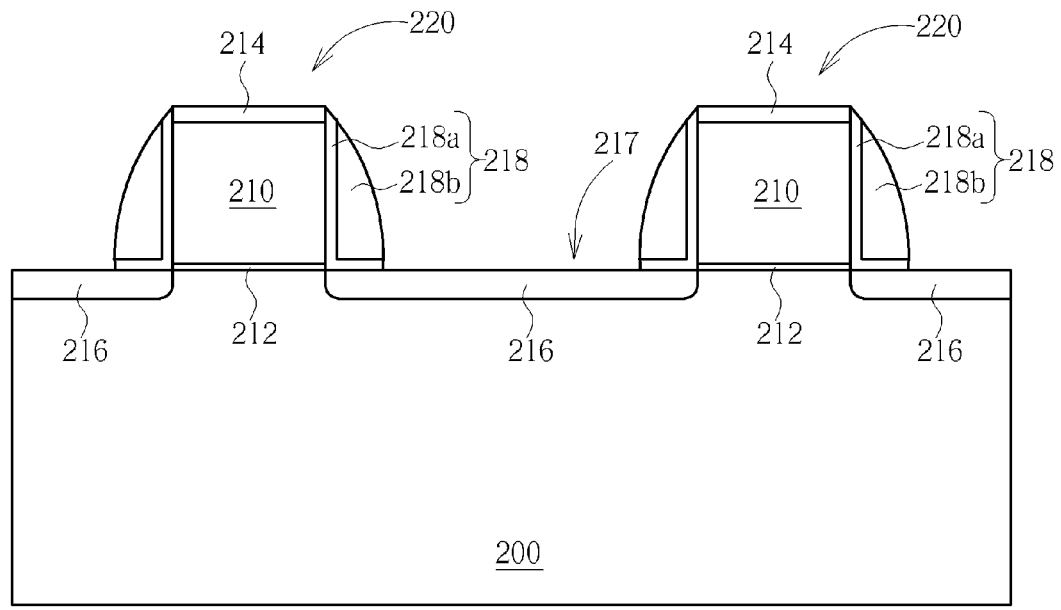
FIGS. 2-7 are drawings illustrating a manufacturing method for a semiconductor structure provided by a preferred embodiment of the present invention.

Please refer to FIGS. 2-7, which are drawings illustrating a manufacturing method for a semiconductor structure provided by a preferred embodiment of the present invention. As shown in FIG. 2, the preferred embodiment first provides a substrate 200. The substrate 200 includes a gate structure 220 formed thereon, and the gate structure 220 includes a gate dielectric layer 212, a gate conductive layer 210, and a cap layer 214 sequentially and upwardly stacked on the substrate 200. It is well-known to those skilled in the art that the cap layer 214 is formed to cover the gate conductive layer 210 to protect the gate conductive layer 210 from damage that may be caused in any process such as photolithograph process, ion implantation, etching process, or any needed cleaning process in the semiconductor fabricating process. LDDs 216 are formed in the substrate 200 at two sides of the gate conductive layer 210 and the gate dielectric layer 212 of the gate structure 220. A spacer 218 is formed on sidewalls of the gate conductive layer 210 and the gate dielectric layer 212. As shown in FIG. 2, the spacer 218 preferably is a multi-layered structure including an L-shaped seal layer 218a and an insulating layer 218b covering the seal layer 218a. The spacer 218 formed on the sidewalls of the gate conductive layer 210 and the gate dielectric layer 212 after forming the LDDs 216 is used to protect the sidewalls of the gate conductive layer 210 and the gate dielectric layer 212.

Figure 3:
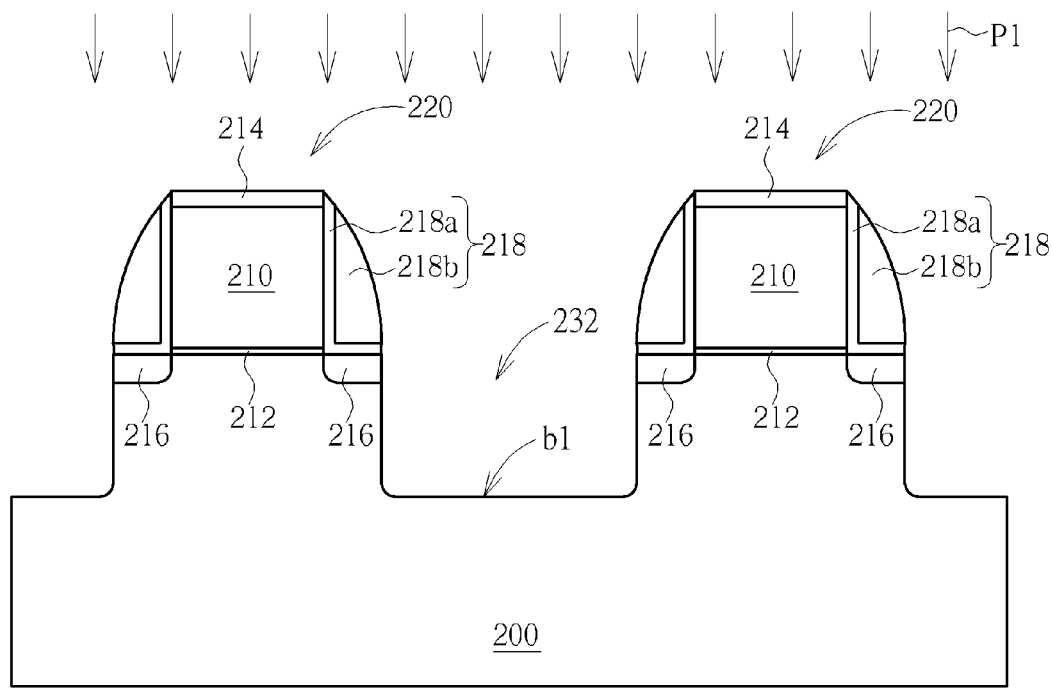

Please refer to FIG. 3. Next, a first dry etching process P1 is performed, to etch the substrate 200 disposed on two sides of the gate structure 220 and the spacer 218. Preferably, the first dry etching process P1 is an anisotropic etching process, such as a gas etching process using the fluorine (F) or chlorine (Cl) and mixed with helium as the carrier gases. After the first dry etching process P1 is performed, a recess 232 is formed in the substrate 200, and the recess 232 is at least disposed between two gate structures 220. In addition, the recess 232 has a U-shaped profile and a flat bottom surface b1.

Figure 4:
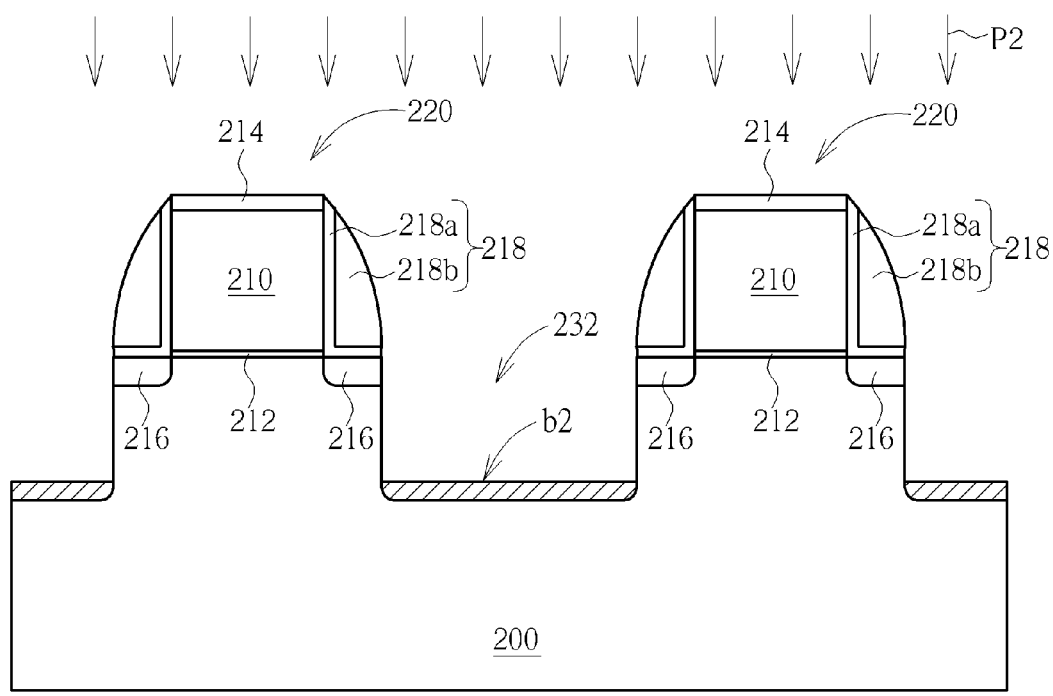

As shown in FIG. 4. Afterwards, an ion implantation P2 is performed, to implant specific ions into the bottom surface b1 of the recess 232, and in this embodiment, the ions used in the ion implantation process P2 include boron ions, phosphate ions, arsenic ions, germanium ions, argon ions or the combination thereof. After the ion implantation process P2 is performed, the anti-etching ability of the bottom surface b1 of the recess 232 is improved, and an anti-etching bottom surface b2 will be formed in the recess 232. In other words, in the following etching processes, the bottom surface b2 is more difficult to be etched than the sidewall of the recess 232 is.

Figure 5:
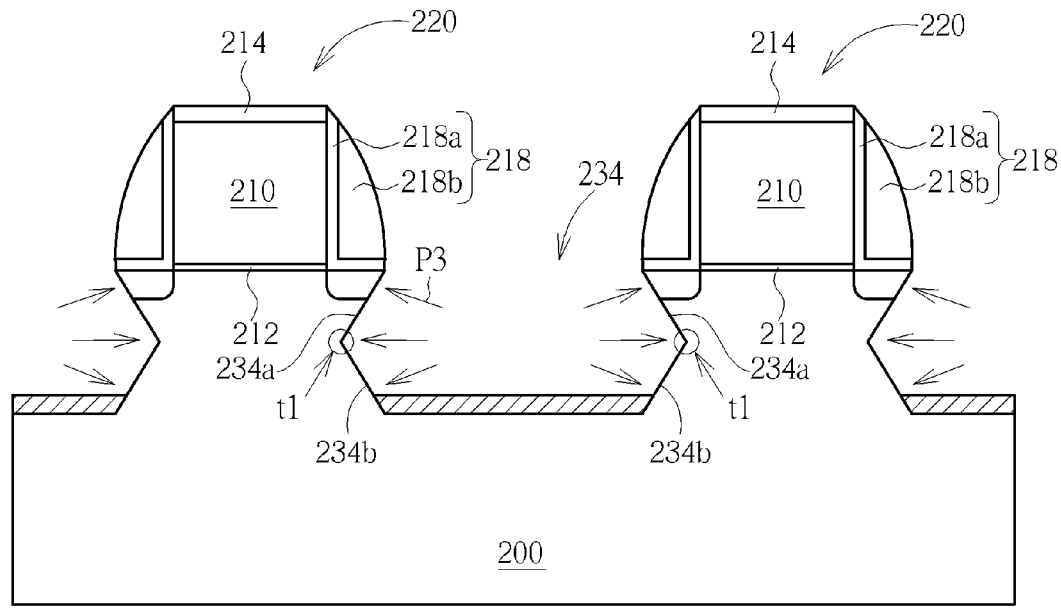

Please refer to FIG. 5. Next, a wet etching process P3 is performed to etch the recess 232 with a tetra methyl ammonium hydroxide (($CH_3$)$_4$NOH, TMAH) solution. In other words, the wet etching process P3 is a TMAH wet etching process. In the preferred embodiment, a concentration of TMAH in the TMAH solution is lower than 5%, and a concentration of water ($H_2O$) is higher than 95%. The wet etching process P3 is performed at a temperature of about 70° C., but not limited to this. Since the bottom surface b2 with higher anti-etching ability is already formed in the recess 232 during the ion implantation process P2, during the wet etching process P3, the etching rate for etching the sidewall of the recess 232 is faster than the etching rate for etching the bottom surface b2. And after the wet etching process P3, the shape (profile) of the recess 232 is changed, and becomes a recess 234 with polygonal cross-section profile. Preferably, the recess 234 has a diamond shaped profile or a hexagonal shaped profile, and having two first sidewalls 234a and two second sidewalls 234b, a tip t1 is between one first sidewall 234a and one second sidewall 234b. In other words, as shown in FIG. 5, the recess 234 has two tips t1, disposed on two sidewalls of the recess 234 respectively, and the two tips t1 are disposed on a same level.

Figure 6:
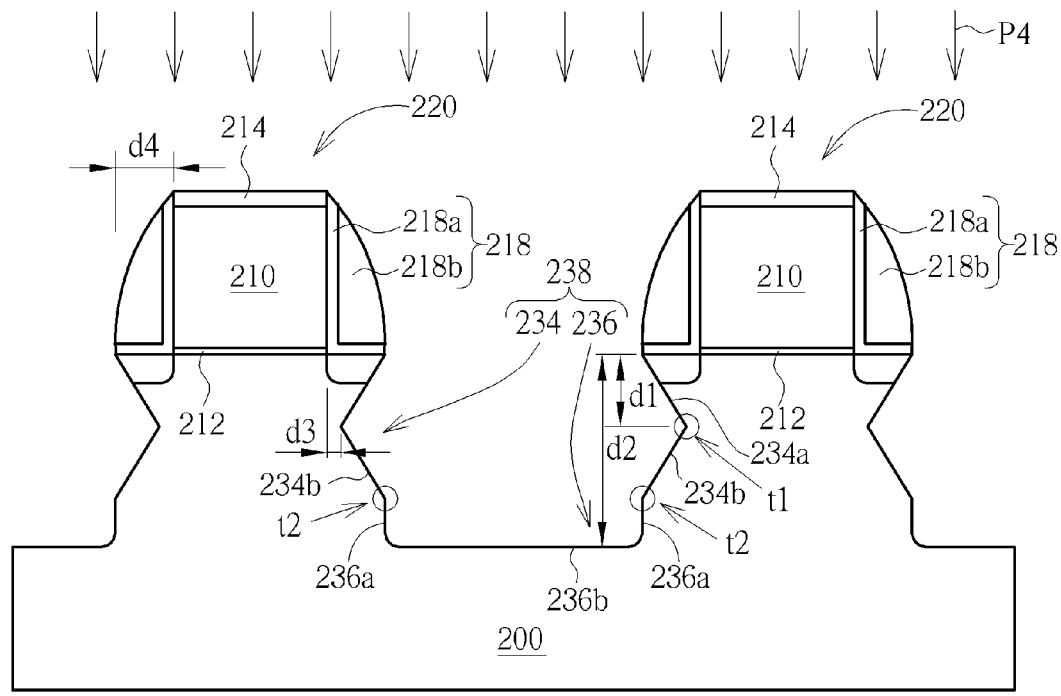

As shown in FIG. 6, a second dry etching process P4 is performed, where the second dry etching process P4 is an anisotropic etching process, to vertically etch the bottom surface b2, and to form the recess 236 in the substrate 200, wherein the recess 236 and the recess 234 are connected to each other, and the recess 236 has a U-shaped profile. More precisely, when viewed in cross section views, the recess 236 has two first sidewalls 236a and a flat bottom surface 236b. The first sidewall 236a of the recess 236 and the second sidewall 234b of the recess 234 have different tilt angles, and a tip t2 is disposed therebetween.

Please refer to FIG. 6. The recess 234 and the recess 236 compose an epitaxial recess 238 of the present invention. The feature of the epitaxial recess 238 is that the lower portion (the recess 236) has a U-shaped profile, and the upper portion (the recess 234) has a diamond-shaped (or hexagonal shaped) profile, and two tips t1 are disposed on two sidewalls of the recess 234. In addition, the recess 234 and the recess 236 are connected to each other and directly contacted.

Besides, the epitaxial recess 238 is formed by performing the steps P1-P4 in sequence, preferably satisfying the following conditions:

(1) The vertical distance between the top surface of the substrate 200 and any tip t1 is d1, wherein d1 is between 90 angstroms and 150 angstroms.

(2) The vertical distance between a bottom surface of the epitaxial recess 238 (also bottom surface 236b of the recess 236) and the top surface of the substrate 200 is d2, wherein d2 is between 550 angstroms and 650 angstroms.

(3) The horizontal distance between a vertical sidewall of the gate structure 210 and any tip t1 is d3, wherein d3 is between 10 angstroms and 50 angstroms.

(4) The spacer 218 is disposed on two sides of the gate structure 210, and the bottom thickness of the spacer 218 is d4, wherein d4 is between 60 angstroms and 100 angstroms.

(5) As mentioned above, d1/d2 is between 0.15 and 0.25.

(6) As mentioned above, d3/d4 is between 0.1 and 0.5.

It can be understand that each distance mentioned above is a preferred example of the present invention, but the present invention is not limited thereto, and it can be adjusted according to actual requirements.

Figure 7:
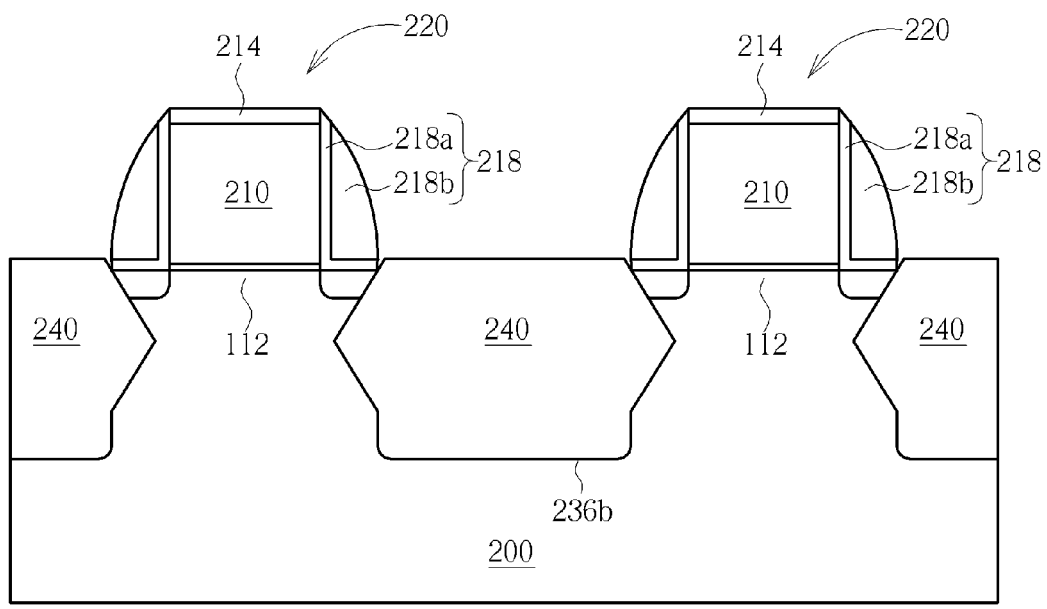

Please refer to FIG. 7. Next, a SEG method P5 is performed to form an epitaxial layer 240 in the recess 238, and the epitaxial layer 240 fills up the recess 238. It is well-known to those skilled in the art that in the SEG method P5, the epitaxial layer 240 is to grow along each surface of the recess 238. Therefore the epitaxial layer 240 having a specific shape shown in FIG. 7 is formed. It is noteworthy that since the recess 238 includes the flat bottom surface 236b, the epitaxial layer 240 obtains a flat bottom accordingly. Furthermore, in the present invention, the epitaxial layer 240 can include a silicon germanium (SiGe) epitaxial layer or a silicon carbide (SiC) epitaxial layer required by p-type or n-type semiconductor structure. Additionally, the cap layer 214 is selectively removed and followed by performing a silicide process to form silicide (not shown) at least on the surface of the epitaxial layers 240. Besides, the embodiment mentioned above takes a planar transistor as an example, but the present invention can also be applied to non-planar transistors, such as finFET, and it should also be within the scope of the present invention.

Compared with the semiconductor structure shown in FIG. 1, the epitaxial recess of the present invention can be formed through performing the steps P1-P4 in sequence. The upper portion of the epitaxial recess has a diamond-shaped (or hexagonal shaped) profile, and the lower portion of the epitaxial recess has a flat bottom. It is noteworthy that the diamond-shaped upper portion has at least a tip directing toward the channel region, therefore the epitaxial layer formed along the surface of the recess obtains a tip toward the channel region. Accordingly, effective stress provided by the epitaxial layer to the channel region is enhanced. On the other hand, the epitaxial layer formed along the flat bottom of the recess obtains a flat bottom, consequently. Therefore, device leakage that used to occur at the tip is avoided. Briefly speaking, the manufacturing method provided by the present invention improves not only enhances the device performance but also the device reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
a substrate, at least two gate structures disposed on the substrate;
a first recess disposed in the substrate between two gate structures, wherein the first recess has a U-shaped cross section profile; and
a second recess, disposed on the first recess, wherein the second recess has a polygonal shaped cross section profile, and has at least two tips on two sides of the second recess, the first recess and the second recess forming an epitaxial recess.

2. The semiconductor structure of claim 1, wherein the polygonal shaped cross section profile is a hexagonal cross section profile.

3. The semiconductor structure of claim 1, wherein the second recess directly contacts the first recess.

4. The semiconductor structure of claim 1, wherein the two tips are disposed on a same level.

5. The semiconductor structure of claim 4, wherein the vertical distance between the top surface of the substrate and the tip is between 90 angstroms and 150 angstroms.

6. The semiconductor structure of claim 1, further comprising an epitaxial layer filled in the epitaxial recess.

7. The semiconductor structure of claim 1, wherein the vertical distance between a bottom surface of the epitaxial recess and the top surface of the substrate is between 550 angstroms and 650 angstroms.

8. The semiconductor structure of claim 1, wherein the horizontal distance between a vertical sidewall of the gate structure and the tip is between 10 angstroms and 50 angstroms.

9. The semiconductor structure of claim 1, further comprising a spacer disposed on two sides of the gate structure, and the bottom thickness of the spacer is between 60 angstroms and 100 angstroms.

* * * * *